(12) United States Patent
Imai et al.

(10) Patent No.: US 8,143,632 B2
(45) Date of Patent: Mar. 27, 2012

(54) LIGHT EMITTING DEVICE AND METHOD FOR PRODUCING THE LIGHT EMITTING DEVICE

(75) Inventors: Yuji Imai, Kanzaki-gun (JP); Satoshi Kamiyama, Nagoya (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 293 days.

(21) Appl. No.: 12/498,758

(22) Filed: Jul. 7, 2009

(65) Prior Publication Data
US 2010/0007267 A1    Jan. 14, 2010

(30) Foreign Application Priority Data

Jul. 9, 2008  (JP) .................... 2008-179172
Jul. 15, 2008  (JP) .................... 2008-183557

(51) Int. Cl.
*H01J 1/62* (2006.01)
*H01J 9/24* (2006.01)

(52) U.S. Cl. .............. 257/89; 257/88; 313/503

(58) Field of Classification Search .......... 313/500–512; 257/81, 98, 89, 77, 676, 21.499 E, 33.61 E, 257/88

See application file for complete search history.

(56) References Cited

U.S. PATENT DOCUMENTS

| | | | |
|---|---|---|---|
| 6,504,179 | B1 | 1/2003 | Ellens et al. |
| 2004/0036079 | A1* | 2/2004 | Nakada et al. .................. 257/81 |
| 2004/0217364 | A1* | 11/2004 | Tarsa et al. ....................... 257/89 |
| 2005/0093116 | A1* | 5/2005 | Palmteer et al. ............... 257/676 |
| 2007/0176531 | A1* | 8/2007 | Kinoshita et al. .............. 313/486 |
| 2008/0106887 | A1* | 5/2008 | Salsbury et al. ................. 362/84 |
| 2008/0128732 | A1* | 6/2008 | Haruna et al. .................. 257/98 |
| 2008/0277670 | A1* | 11/2008 | Kamiyama et al. ............. 257/77 |
| 2008/0308822 | A1* | 12/2008 | Tsang et al. .................... 257/89 |

FOREIGN PATENT DOCUMENTS

JP    2008-85324 A    4/2008

* cited by examiner

*Primary Examiner* — Karabi Guharay
*Assistant Examiner* — Elmito Breval
(74) *Attorney, Agent, or Firm* — Roberts Mlotkowski Safran & Cole, P.C.; David S. Safran

(57) ABSTRACT

To provide a light emitting device that does not experience a decline in radiant efficiency in use, enables luminous flux from LED elements to be increased, and white light of good color rendering to be produced, and heat generated by the LED elements to be smoothly transmitted to an SiC fluorescent substrate. The light emitting device is provided with first LED elements for emitting UV radiation, second LED elements for emitting visible light, an SiC fluorescent substrate that is mounted with the first LED elements and the second LED elements and is made of SiC doped with at least one of B and Al as well as N and emits visible light when excited by radiation emitted from the first LED elements, and has a body made of inorganic material.

10 Claims, 10 Drawing Sheets

LIGHT EMITTING DEVICE AND METHOD FOR PRODUCING THE LIGHT EMITTING DEVICE

BACKGROUND OF THE INVENTION

1. Field of Invention

This invention relates to a light emitting device that is provided with LED elements and emits white light.

2. Description of Related Art

A light emitting device has conventionally been known that emits white light by combining an LED element and fluorescent material (see, e.g., Japanese Patent Application Publication No. 2003-535478 and corresponding U.S. Pat. No. 6,504,179). The light emitting device described in this document is provided with an LED element that emits radiation of 300-470 nm and generates white light as a result of this radiation being converted into light having a longer wavelength fully or partially by the fluorescent material excited by this radiation. The fluorescent material is dispersed in sealing resin that seals the LED element.

A light emitting device has also been known that can generate white light by combining a red LED element, a green LED element and a blue LED element (See, e.g., Japanese Laid-open Application No. 2008-085324). However, in the light emitting device described in Japanese Patent Application Publication No. 2003-535478 and corresponding U.S. Pat. No. 6,504,179, the heat resistance of the fluorescent material is low in the sealing resin, and the emission efficiency of the light emitting device declines when the temperature of the device increases when in use. Moreover, since the heat quantity of an LED element is restricted, it is difficult to increase luminous flux by flowing a high electric current to the LED element.

As shown in the light emitting device described in Japanese Laid-open Application No. 2008-085324, it may be possible to generate white light using red, green and blue LED elements in place of a fluorescent material. However, the full width at half maximum of each LED element is extremely small compared with that of a fluorescent material, the color rendering of white light generated declines. Furthermore, in the case that the heat quantity of an LED element is not restricted, it becomes necessary to smoothly transmit heat generated at each element to a substrate on which the element is carried.

SUMMARY OF THE INVENTION

The present invention was made in view of the above-mentioned circumstances. Thus, an object of the present invention is to provide a light emitting device that does not reduce radiant efficiency when in use, enables to increase luminous flux by flowing a high electric current to LED elements, and produces white light of good color rendering as well as a method for producing it.

Another object of the invention is to provide a light emitting device capable of smoothly transmitting heat generated by an LED element to a substrate as well as a method for producing it.

In order to solve the above-mentioned problems, in accordance with a first aspect the present invention provides a light emitting device having first LED elements for emitting UV radiation, second LED elements for emitting visible light, an SiC fluorescent substrate that carries the first LED elements and the second LED elements and is made of SiC doped with at least one of B and Al as well as N and emits visible light when excited by radiation emitted from the first LED elements, and an AuSn type alloy layer that binds the first LED elements and the second LED elements to the SiC fluorescent substrate and comprises columnar crystals extending substantially in the perpendicular direction relative to the SiC fluorescent substrate.

In the above-mentioned first light emitting device, the peak wavelength of the first LED elements is 408 nm or shorter, and the peak wavelength of the second LED elements exceeds 408 nm.

In the above-mentioned first aspect, the SiC fluorescent substrate comprises a periodic structure formed in a manner of comprising a period shorter than the emission wavelength of the first LED elements on the carrying surface of the first LED elements and the second LED elements.

In the above-mentioned first aspect of the light emitting device, the body has an opening, the light emitting device comprising a transparent member that is provided in the opening and made of inorganic material transparent to light emitted from the second LED elements and the SiC fluorescent substrate.

The above-mentioned transparent material is characterized by cutting at least part of the UV radiation components.

In order to solve the above-mentioned problems, in a second aspect the present invention provides a light emitting device having UV LED elements for emitting UV radiation, blue LED elements for emitting blue light, green LED elements for emitting green light, red LED elements for emitting red light, an SiC fluorescent substrate that is mounted with the UV LED elements, the blue LED elements, green LED elements and the red LED elements and made of SiC doped with at least one of B and Al as well as N and emits visible light when excited by radiation emitted from the UV LED elements, and a body that contains the SiC fluorescent substrate and is made of inorganic material.

In order to solve the above-mentioned problems, in a third aspect the present invention provides a light emitting device having first LED elements for emitting UV radiation, second LED elements for emitting visible light, an SiC fluorescent substrate that is mounted with the first LED elements and the second LED elements and made of SiC doped with at least one of B and Al as well as N and emits visible light when excited by radiation emitted from the first LED elements, and an AuSn type alloy layer that binds the first LED elements and the second LED elements to the SiC fluorescent substrate and comprises columnar crystals extending substantially in the perpendicular direction relative to the SiC fluorescent substrate.

The above-mentioned light emitting device according to the third aspect is characterized by having a body that contains the SiC fluorescent substrate and is made of inorganic material.

In the above-mentioned light emitting device according to the third aspect, the peak wavelength of the first LED elements is 408 nm or shorter, and the peak wavelength of the second LED elements exceeds 408 nm.

In the above-mentioned third aspect of the light emitting device, the second LED elements are of three types of LED elements, i.e., blue LED elements, green LED elements and red LED elements.

The method for producing the light emitting device according to the third aspect has an Sn film forming step of forming an Sn film on the carrying surface of the SiC fluorescent substrate, an Au film forming step of forming an Au film on the mounting surface of the first LED elements and the second LED elements, a contacting step of contacting the Au film formed on the first LED elements and the second LED elements to the surface of the Sn film formed on the carrying surface of the SiC fluorescent substrate, and a binding step of binding the first LED elements and the second LED elements to the SiC fluorescent substrate by heating the SiC fluorescent substrate in an atmosphere of forming gas contacting a mixed gas of hydrogen gas and nitrogen gas in the state that the Sn film and Au film are contacted to each other.

Particularly, in the method for producing the light emitting device according to the third aspect, the Sn film and the Au film are contacted to each other in the contacting process by placing the carrying surface of the SiC fluorescent substrate upward and the mounting surface of the first LED elements and the second LED elements downward, and then mounting the first LED elements and the second LED elements on the SiC fluorescent substrate, and the first LED elements and the second LED elements are bound to the SiC fluorescent substrate in the binding step by heating the substrate in the state of mounting the first LED elements and the second LED elements on the SiC fluorescent substrate.

EFFECT OF THE INVENTION

According to the present invention, since an SiC fluorescent screen has a high heat resistance property, the radiant efficiency does not decline when in use unlike a conventional device. Moreover, since the heat resistance of the device increases as a whole, it becomes possible to increase the luminous flux by delivering a high electric current to LED elements. Furthermore, white light of good color rendering can be generated because the SiC fluorescent substrate can emit light having a large full width at half maximum compared with that of LED elements and the like when excited by radiation emitted from the first LED elements.

Furthermore, heat generated from each LED element can smoothly be transmitted to the SiC fluorescent substrate because the SiC fluorescent substrate is bound to each element by an AuSn type alloy layer having columnar crystals.

BRIEF DESCRIPTION OF DRAWINGS

FIG. 5(b) being a side view of the SiC fluorescent substrate at the time of mounting LED elements and FIG. 5(c) being a side view of the SiC fluorescent substrate after LED elements are mounted.

DETAILED DESCRIPTION OF THE INVENTION

Figure 1:
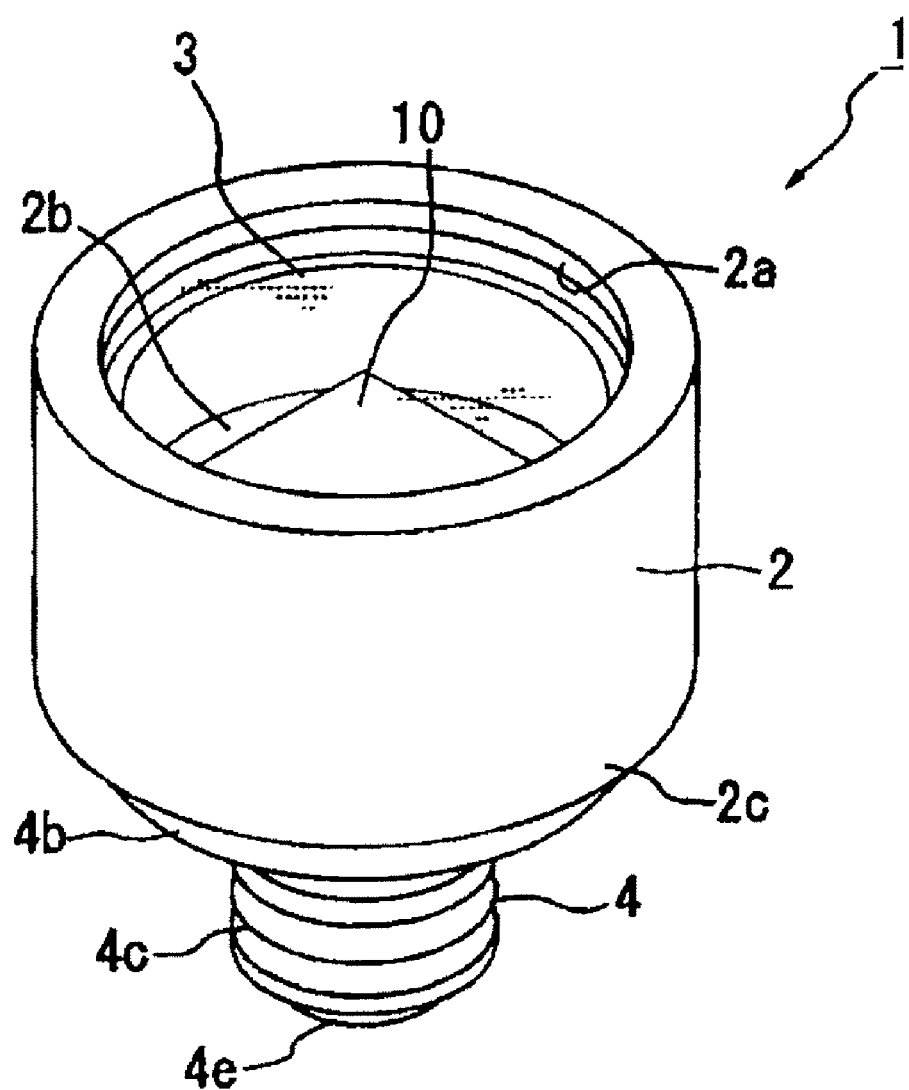
FIG. 1 is a perspective view of a first embodiment of a light emitting device of the present invention.

FIG. 1 is a perspective view of an embodiment of a light emitting device 1 of the present invention that has a cylindrical body 2 with an opening 2a formed on one end, a lens 3 for closing off the opening 2a, an electric terminal part 4 formed on the other end of the body 2, and an SiC fluorescent substrate 10 made of SiC that is located inside the body 2 and on which UV LED elements and visible LED elements are mounted.

In the present embodiment, a description is given such that the one end of the body 2 is in the upward direction and the other end in the downward direction. In the body 2 are contained multiple types of LED elements to which electric power is supplied from the electric terminal part 4. An SiC fluorescent substrate 10 is excited by UV radiation emitted from LED elements to emit light. Blue light, green light and red light emitted from the LED elements pass through the lens 3 without going through any wavelength conversion.

Figure 2:
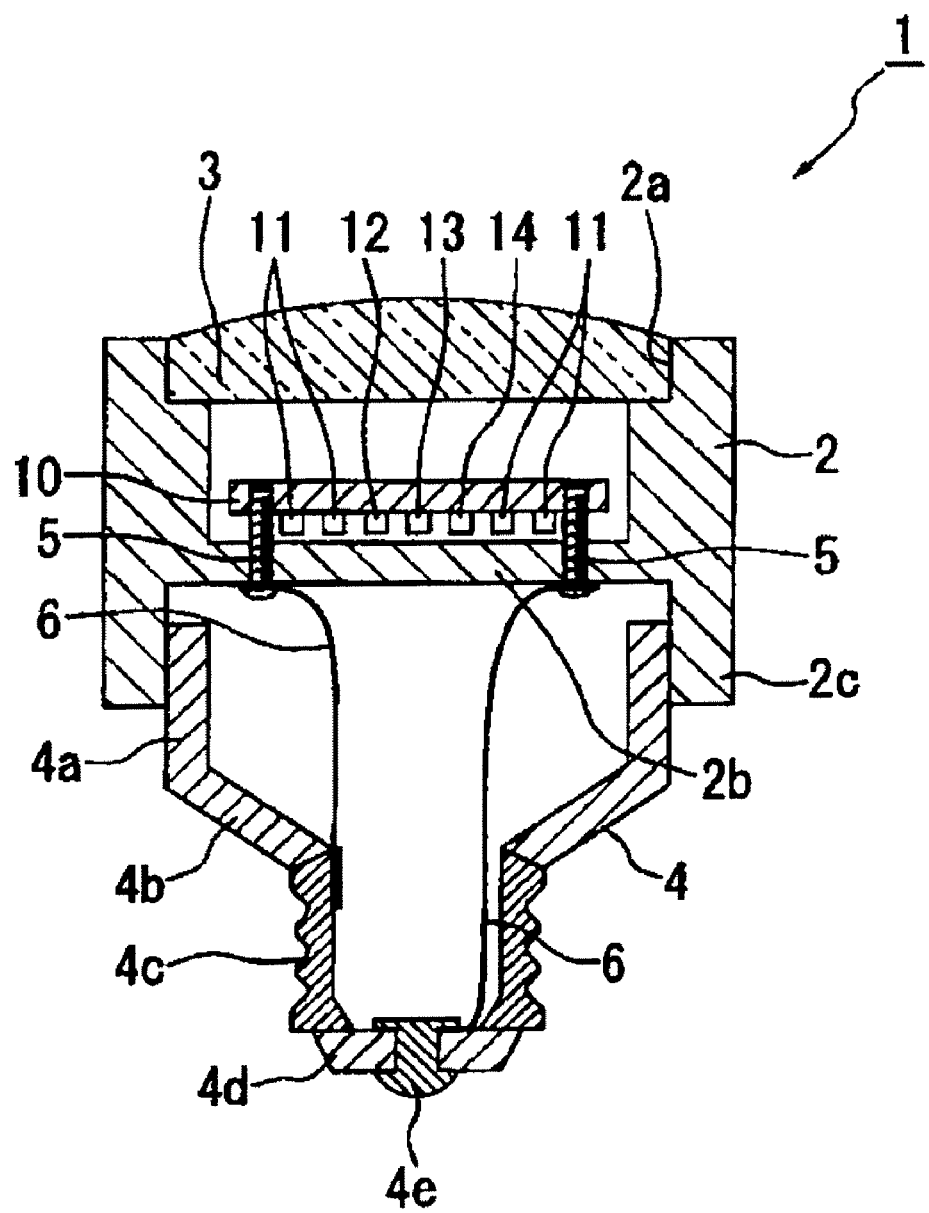
FIG. 2 is a schematic vertical sectional view of the light emitting device of FIG. 1.

As shown in FIG. 2, the body 2 is made of inorganic material. Its lower end is closed off, and the closed part constitutes a bottom part 2b. The body 2 is made of ceramics, which is AlN in the present embodiment. On the bottom part 2b is fixed an SiC fluorescent substrate 10 on which UV LED elements 11, blue LED elements 12, green LED elements 13 and red LED elements 14 are mounted.

Any suitable method may be used for fixing the SiC fluorescent substrate 10. In the present embodiment, the SiC fluorescent substrate 10 is fixed with screws that are screwed into the bottom part 2b. In the present embodiment, the SiC fluorescent substrate 10 is separate from the bottom part 2b, and LED elements 11, 12, 13, 14 are mounted on the surface facing the bottom part 2b. In the opening 2a of the body 2 is formed a step, and the lens 3 is fixed on the step part. Moreover, the body 2 has a flange 2c that protrudes downward from the bottom part 2b. In the present embodiment, the flange 2c is formed in the circumferential direction.

The electric terminal part 4 is made of inorganic material and has a thread for being screwed into a given socket used for supplying electric power. The electric terminal part 4 has a cylindrical part 4a that is fixed on the inner circumference of the flange 2c, a sloping part 4b that is formed continuously from the lower end of the cylindrical part 4a and tapers off downward, a first electrode part 4c that is provided on the lower end of the sloping part 4b and has an external surface on which a male screw is formed, an insulating part 4d that is formed continuously from the lower end of the first electrode part 4c and extends inward in the radial direction, and a second electrode 4e that closes the inner side of the insulating part 4d in the radial direction.

The cylindrical part 4a, the sloping part 4b and the insulating part 4d are made of ceramics that has insulating properties. The first electrode 4c and the second electrode 4e are made of metal that has conductive properties. The cylindrical part 4a, the sloping part 4b and the insulating part 4d are preferably made of the same material as that of the body 2. The first electrode 4c and the second electrode 4e are electrically connected to the screws 5 with internal electric leads 6. In the present embodiment, the screws 5 are made of conductive metal and are electrically connected to a wiring pattern of the SiC fluorescent substrate 10 when screwed into the SiC fluorescent substrate 10.

The lens 3 is made of glass. Its exit surface has an outward (upward) convex shape, thereby converging radiation exiting from the body 2. If UV radiation is contained in the transmitted radiation, glass can cut 70% or more of the UV radiation by itself, for example. In the present embodiment, on the inner surface of the lens 3, in the body 2, a multi-layered reflecting film (DBR film) is formed that reflects radiation emitted from the UV LED elements as described below and is made of inorganic material. The multi-layered reflecting film may be formed of $SiO_2/TiO_2$, for example. Inorganic material whose reflective index is higher for UV radiation than that of glass may be coated on the inner surface of glass of the lens 3 in place of the multi-layered reflecting film.

The SiC fluorescent substrate 10 is made of 6 H type SiC crystals having a periodic structure every six layers.

The SiC fluorescent substrate 10 contains N as donor impurities as well as Al and B as acceptor impurities. The SiC fluorescent substrate 10 is doped with Al having a concentration of $2\times10^{18}$ $cm^{-3}$, for example, B having a concentration of $1\times10^{19}$ $cm^{-3}$, for example, and N having a concentration of $10^{19}$ $cm^{-3}$, for example. Although any concentration is acceptable for Al, B and N, the sum of the concentrations of Al and B must be smaller than the concentration of N in order to excite and emit light from the SiC fluorescent substrate 10.

The SiC fluorescent substrate 10 emits fluorescent light as a result of the recombination of donors and acceptors when excited by UV radiation. This fluorescent light has an extremely large full width at half maximum compared with the radiation emitted from the LED elements.

The SiC fluorescent substrate 10 can be produced by any suitable method. For example, it can be produced by growing SiC crystals by the sublimation method or the chemical vapor deposition method. In this case, the concentration of nitrogen can be set in any way in the SiC fluorescent substrate 10 by properly adjusting the partial pressure of nitrogen gas ($N_2$) in the atmosphere while growing crystals. On the other hand, the concentrations of Al and B can be set in any way in the SiC fluorescent substrate 10 by mixing proper amounts of Al and B singly or proper amounts of an Al compound and a B compound relative to that of raw material.

Figure 3:
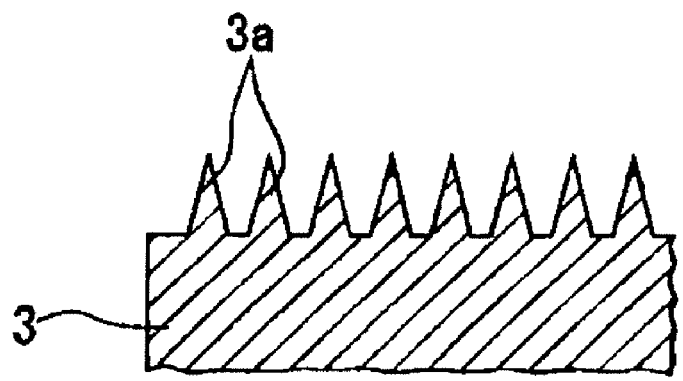
FIG. 3(a) is an enlarged partial vertical sectional view of the SiC fluorescent substrate in the light emitting device of FIGS. 1 and 2.
FIG. 3(b) is a partial plan view of the SiC fluorescent substrate.
Figure 3:
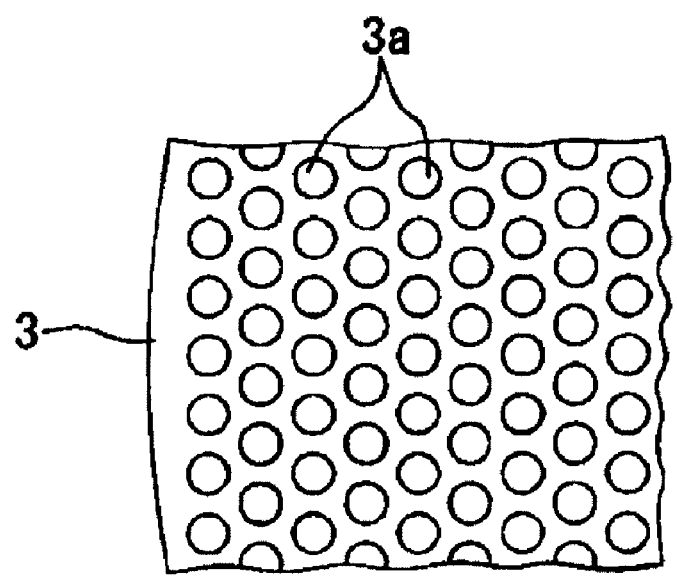

As shown in FIG. 3(a), the SiC fluorescent substrate 10 has a predetermined periodic structure on the mounting surface of each LED element and the surface on the opposite side. The periodic structure is constituted of a large number of convex parts 10e substantially having a cone shape. Convex parts 10e are periodically arranged along the carrying surface of the SiC fluorescent substrate 10. The shape of each convex part 10e may be a polygonal pyramid, such as a triangular pyramid and a quadrangular pyramid. Moreover, it is optional whether or not a periodic structure is provided.

As shown in FIG. 3(b), convex parts 10e are arranged in a triangle lattice shape at a predetermined period in a plan view. Although any average period is acceptable for convex parts 10e, it is 200 nm in the present embodiment.

The average period is defined as an average peak distance between convex parts 10e that are adjacent to each other. Each convex part 10e substantially has a cone shape: an average bottom diameter is 150 nm and an average height 400 nm. Thus, reflection can be prevented on the surface of the SiC fluorescent substrate 10 by forming a sufficiently small periodic structure compared with the optical wavelength emitted from the UV LED elements 11. Accordingly, near ultraviolet radiation emitted from each UV LED element can efficiently be made incident on the SiC fluorescent substrate 10, and white light formed by converting the wavelength of near ultraviolet radiation can efficiently be exited from the SiC fluorescent substrate 10.

Figure 4:
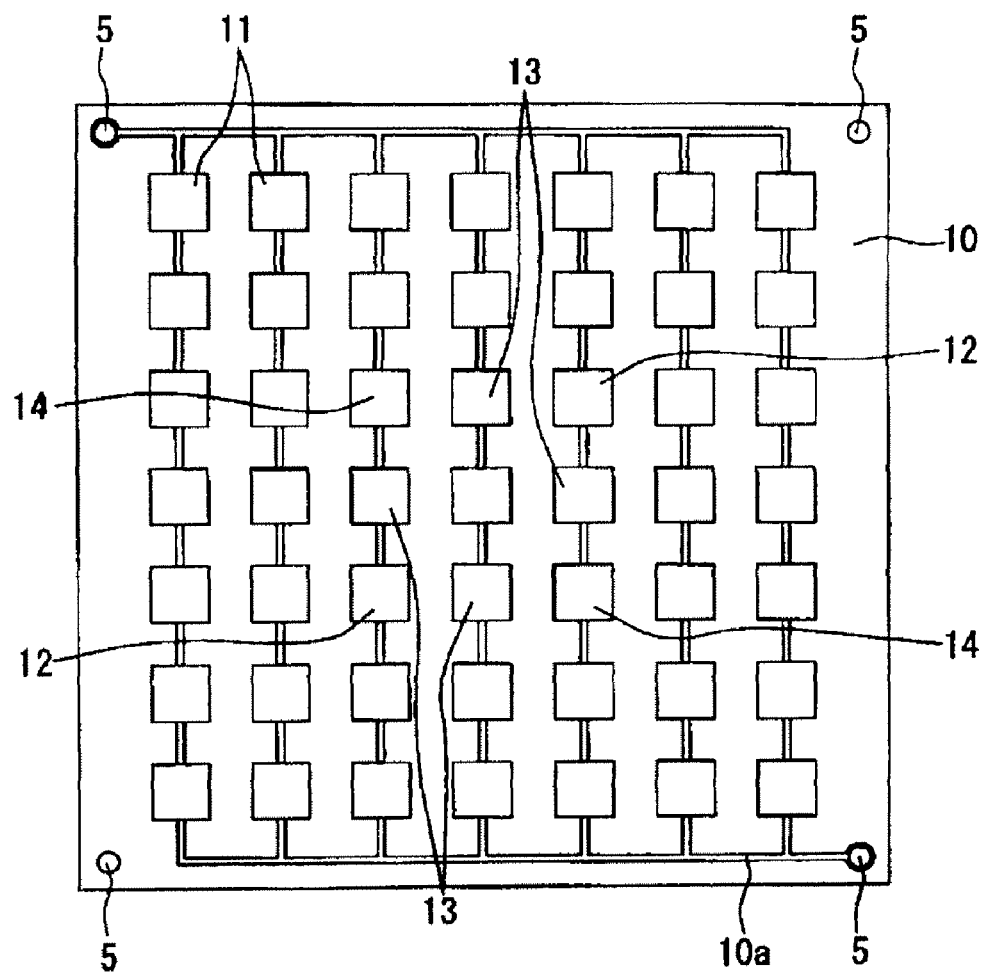
FIG. 4 is a schematic plan view of the SiC fluorescent substrate of the first embodiment.

FIG. 4 is a schematic plan view of an SiC fluorescent substrate 10 that has a square shape in a plan view. LED elements 11, 12, 13, 14 are arranged horizontally and vertically at predetermined intervals. In the present embodiment, each LED element 11, 12, 13, 14 is about 350 μm by 350 μm square in a plan view. The distance between LED elements 11, 12, 13, 14 is about 20 μm. In the present embodiment, LED elements 11, 12, 13, 14 are not sealed. Moreover, in the present embodiment, 49 LED elements 11, 12, 13, 14 are mounted on the SiC fluorescent substrate 10 (7 columns×7 rows). More specifically, they are 41 UV LED elements 11, 2 blue LED elements 12, 4 green LED elements 13 and 2 red LED elements 14.

As a first LED element, the UV LED element 11 emits radiation having a peak wavelength of 380 nm, for example. As a second LED element, the blue LED element 12 emits light having a peak wavelength of 450 nm, for example. As a second LED element, the green LED element 13 emits light having a peak wavelength of 550 nm, for example. As a second LED element, the red LED element 14 emits light having a peak wavelength of 650 nm, for example. Material properties are not particularly restricted for the LED elements 11, 12, 13, 14. For example, the following materials may be used: AlInGaN, AlGaN, InGaN, GaN, ZnSe, GaP, GaAsP, AlGaInP, AlGaAs and others.

The SiC fluorescent substrate 10 is made of inorganic material that has an insulating property. On its surface a wiring pattern 10a is formed. Moreover, the SiC fluorescent substrate 10 is tightened to the body 2 with screws 5 at four corners. Among the four screws 5, a diagonal pair of the screws is electrically connected with the wiring pattern 10a (see, upper left and lower right in FIG. 4).

Figure 5:
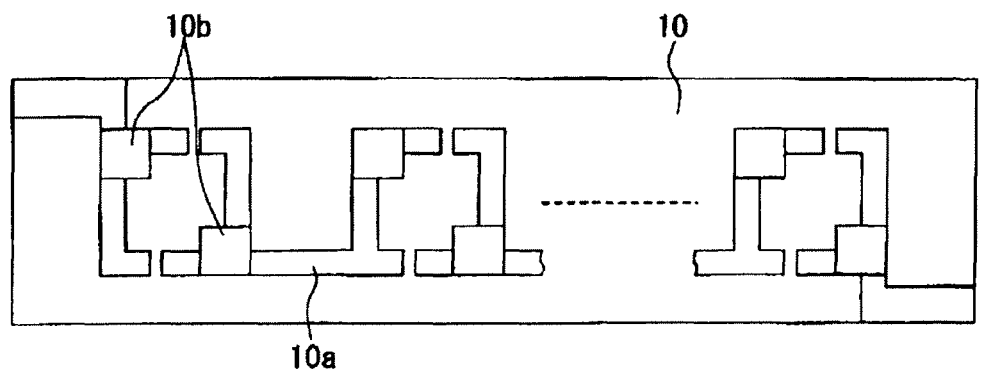
FIGS. 5(a)-5(c) are explanatory views showing the method for mounting LED elements onto the SiC fluorescent substrate of the first embodiment, FIG. 5(a) being a plan view of the SiC fluorescent substrate before LED elements are mounted.
Figure 5:
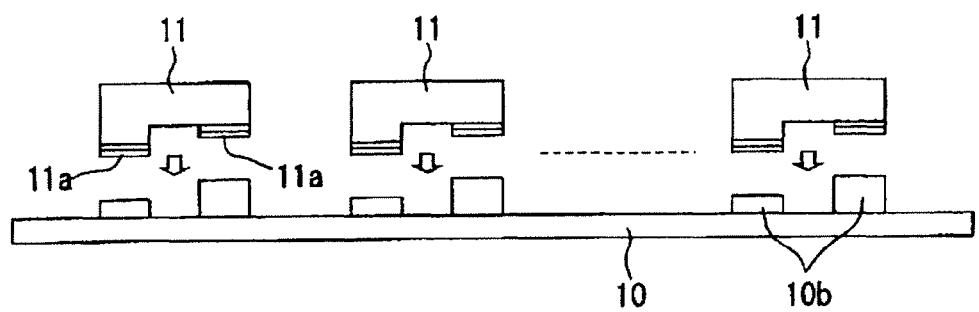
Figure 5:
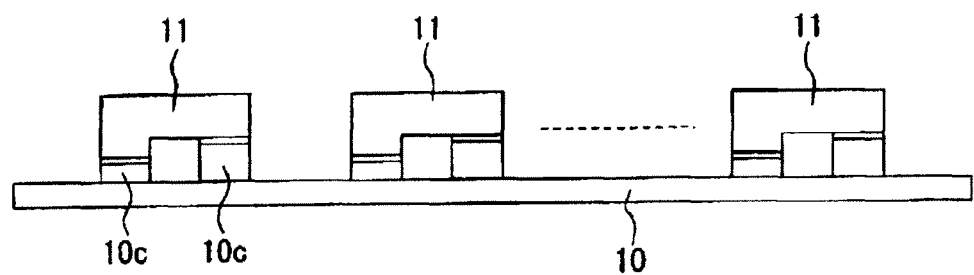

FIGS. 5(a)-5(c) are explanatory views showing one embodiment of the method for mounting LED elements onto an SiC fluorescent substrate.

As shown in FIG. 5(a), on the SiC fluorescent substrate 10 a wiring pattern 10a made of Au is formed. An Sn film 10b is formed at a position where it is electrically connected to each LED element 11. In FIG. 5(a), the flip chip type of LED elements 11 is illustrated.

On the other hand, as shown in FIG. 5(b), an Au film 11a is formed on a pair of electrodes of each LED element. As shown by arrows in FIG. 5(b), each LED element is mounted on the Sn film 10b of the SiC fluorescent substrate 10 moving the Au film 11a downward.

In this state, the SiC fluorescent substrate 10 is heated in an atmosphere in which forming gas containing a mixture of hydrogen gas and nitrogen gas is flowing in order to bind each LED chip 11 to the SiC fluorescent substrate 10. As a result, as shown in FIG. 5(c), each LED chip 11 is connected to the wiring pattern 10a of the SiC fluorescent substrate 10 through an AuSn alloy 10C.

In producing a light emitting device, each LED element 11, 12, 13, 14 is mounted on the SiC fluorescent substrate 10 by the following steps: an Sn film forming step of forming an Sn film 10b on the carrying surface of the SiC fluorescent substrate 10; an Au film forming step of forming an Au film 11a on the mounting surface of each LED element 11, 12, 13, 14; a contacting step of contacting the Au film 11a formed on each LED element 11, 12, 13, 14 to the surface of the Sn film 10b formed on the carrying surface of the SiC fluorescent substrate 10; and a binding step of binding each LED element 11, 12, 13, 14 to the SiC fluorescent substrate 10 by heating the SiC fluorescent substrate 10 in the atmosphere of forming gas made of a mixture of hydrogen gas and nitrogen gas in the state that the Sn film 10b and Au film 11a are in contact with each other.

In the present embodiment, the Sn film 10b and the Au film 11a are brought into contact with each other in the contacting step by moving the carrying surface of the SiC fluorescent substrate 10 upward and the mounting surface of each LED element 11, 12, 13, 14 downward, and then, mounting each LED element 11, 12, 13, 14 on the SiC fluorescent substrate 10. In the bonding step, each LED element 11, 12, 13, 14 is bound to the SiC fluorescent substrate 10 by heating the SiC fluorescent substrate 10 in the state that each LED element 11, 12, 13, 14 is mounted on the SiC fluorescent substrate 10.

Specifically, an SiC wafer is prepared first that contains multiple SiC fluorescent substrates 10 doped with predetermined acceptor and donor. This SiC wafer is divided into multiple SiC fluorescent substrates 10 by dicing, for example. As shown in FIG. 5(a), a wiring pattern 10a made of Au, for example, is formed on a portion of the SiC wafer where the SiC fluorescent substrate 10 is formed. The Sn film 10b is formed at a position of the carrying surface where each LED element is to be electrically connected. This Sn film is formed by an EB deposition method (i.e., electron beam deposition method), for example, and is 1-8 μm in film thickness (e.g., 3 μm). The flip chip type is illustrated for each LED element 11 in FIG. 5(a).

On the other hand, as shown in FIG. 5(b), an Au film 11a is formed on a pair of electrodes of each LED element 11 as the mounting surface. This Au film is formed by the EB deposition method, for example, and is 0.1-1.0 μm in film thickness (e.g., 0.2 μm). As shown by the arrows in FIG. 5(b), each LED element 11 is mounted on the Sn film 10b of the Sic fluorescent substrate 10 moving the Au film 11a downward.

Then, the SiC fluorescent substrate 10 on which the LED elements 11, 12, 13, 14 are mounted is placed in a thermal processing container. An AuSn type alloy layer 10c alloyed from Sn and Au is formed by heating the SiC fluorescent substrate 10 in the atmosphere in which forming gas containing a mixture of hydrogen gas and nitrogen gas is flowing. The percentage of hydrogen gas contained in this forming gas is less than 10% (e.g., 5%). The flow rate of the forming gas is 50-350 cm$^3$/min (e.g., 300 cm$^3$/min).

The thermal processing conditions are as follows: the heating temperature is 250-350° C. (e.g., 300° C.) and the processing time 1-20 minutes (e.g., 10 minutes). As a result, as shown in FIG. 5(c), each LED chip 11 is bound to the SiC fluorescent substrate 10 through the AuSn type alloy layer 10c. In the present embodiment, the AuSn type alloy layer 10c is formed by the weight of LED elements 11, 12, 13 and 14. However, each LED element 11, 12, 13, 14 may be pressurized under a pressure of 10-50 g/cm$^2$, for example. Subsequently, the SiC wafer is divided into multiple SiC fluorescent substrates 10 by dicing or the like, and then each SiC fluorescent substrate 10 is fixed on the bottom part 2b of the body 2 with screws 5. Then, the electric terminal part 4 is connected to the flange 2c of the body 2, and the SiC fluorescent substrate 10 and electrode parts 4c and 4e are electrically connected to each other with internal electric leads 6. In this manner, the light emitting device is made.

Thus, in binding LED elements 11, 12, 13, 14 to the SiC fluorescent substrate 10, it is not necessary to form an alloy layer made of AuSn alloy in advance on the SiC fluorescent substrate 10 and each LED chip 11, 12, 13, 14. Moreover, since each LED element 11, 12, 13, 14 is bound to the SiC fluorescent substrate 10 by the weight of each LED element 11, 12, 13, 14, it is not necessarily needed to pressurize each LED element 11, 12, 13, 14, thereby suppressing any harmful influence arising out of pressurization. Moreover, since columnar crystals are formed in the AuSn alloy 10c, LED elements 11, 12, 13, 14 can have high radiant efficiency for an electric current, and excellent heat resistance and heat conductivity are provided to the joining area by the AuSn alloy 10c.

In the light emitting device having the above-mentioned constitution, electric power can be supplied to the LED elements 11, 12, 13, 14 by screwing the electric terminal part 4 into an external socket. When an electric current is applied to the LED elements 11, 12, 13, 14, radiation having a predetermined wavelength is emitted from those LED elements 11, 12, 13, 14.

UV radiation emitted from a UV LED element 11 to the side of the SiC fluorescent substrate 10 becomes incident on the SiC fluorescent substrate 10 from the carrying surface and exits from the SiC fluorescent substrate 10 after it is absorbed by the SiC fluorescent substrate 10 and converted into white light. The white light exited from the SiC fluorescent substrate 10 passes through the lens 3 and then is emitted to the outside from the body 2. UV radiation incident on the lens 3 from a UV LED element 11 that is not converted in its wavelength is reflected to the side of the SiC fluorescent substrate 10 by a multi-layered reflecting film of the lens 3 and then becomes incident on the SiC fluorescent substrate 10. After it is absorbed by the SiC fluorescent substrate 10 and converted into white light, it exits from the SiC fluorescent substrate 10.

In this case, since a periodic structure is formed on the carrying surface of the SiC fluorescent substrate 10 and its opposite surface, UV radiation is incident on the SiC fluorescent substrate 10, and white light exits form the SiC fluorescent substrate 10 with high efficiency. Moreover, light is emitted by donor-acceptor pairs inside the SiC fluorescent substrate 10 using UV radiation as excitation radiation. In the present embodiment, Al and B are doped as acceptors, and pure white color is emitted by light having a broad wavelength spanning from the blue region to the red region with a peak wavelength in the green region. With the emission of this pure white color, it is possible to generate white light having a higher color rendering than that generated by a conventional light emission device that combines a blue LED element and a yellow fluorescent screen. The light emitting device 1 using LED elements according to the present embodiment can be used as an alternative to a conventional illumination device using a halogen lamp.

Visible light emitted from the LED elements 11, 12, 13, 14 (i.e., blue light, green light and red light in the present embodiment) other than the UV LED elements 11 is incident on the SiC fluorescent substrate 10 from its rear surface and then exits form the front surface of the SiC fluorescent substrate 10 without going through any conversion in wavelength. This is because the SiC fluorescent substrate 10 is excited by radiation having a wavelength of 408 nm or shorter and is transparent to radiation that exceeds 408 nm in its wavelength. Visible light that exits from the SiC fluorescent substrate 10 passes through the lens 3 to be emitted to the outside of the body 2. Thus, by supplying electric power to the LED elements 11, 12, 13, 14, a mixed light of white light generated by fluorescent light of the SiC fluorescent substrate 10 and blue light, green light and red light that pass through the SiC fluorescent substrate 10 can be emitted to the outside. Accordingly, a blue component, a green component and a red component can be provided by blue LED elements 12, green LED elements 13 and red LED elements 14 in addition to the pure white fluorescent light of the SiC fluorescent substrate 10, thereby generating white light having an extremely high color rendering.

Furthermore, since the lens 3 is used for cutting UV radiation, UV radiation is never emitted to the outside of the body 2. In addition, since the lens 3 is used for reflecting UV radiation to the inside of the body 2, UV radiation is contained inside the body 2 so that the SiC fluorescent substrate 10 can be excited efficiently.

In the present embodiment, a user can feel that the emitted white light is brighter because the number of green LED elements 13 is larger than the number of blue LED elements 12 as well as the number of red LED elements 14. This is because the visual sensitivity of humans is the highest in the green region.

Furthermore, at a time when each LED element 11, 12, 13, 14 emits radiation, each LED element 11, 12, 13, 14 generates heat.

Since inorganic material is used for the body 2, the lens 3, the electric terminal part 4, the SiC fluorescence substrate 10, and the like in the light emitting device 1 according to the present embodiment, heat resistance is highly advanced compared with a conventional light emitting device having an LED element sealed with resin containing fluorescent material or using a lens made of resin. Accordingly, it is possible to eliminate a heat discharging mechanism that is conventionally needed or to increase luminous flux by increasing the electric current for the LED elements 11, 12, 13, 14, which is extremely advantageous at the time of practical use. In view of heat resistance, it is preferred to not use any resin in the light emitting device 1.

Because each LED element 11, 12, 13, 14 and the SiC fluorescent substrate 10 are connected to each other by the AuSn type alloy layer 10c in the light emitting device 1 according to the present embodiment, heat generated in each LED element 11, 12, 13, 14 is smoothly transmitted to the SiC fluorescent substrate 10. The heat transmitted to the SiC fluorescent substrate 10 is transmitted to the body 2 from the SiC fluorescent substrate 10 and dissipated to the ambient air.

In the above-mentioned embodiment, a reflecting film that reflects UV radiation is used for the lens 3. However, a UV cutting film may be used for the lens 3 as well. A UV cutting film may be made by containing an inorganic UV absorbent in inorganic polymer, for example, and formed on at least one face of the lens 3. Or, it may be an intermediate film of laminated glass. The lens 3 may be made of inorganic material other than glass as far as it allows visible light emitted from the body 2 to pass through. In this body, it is also preferred to use material that absorbs UV components and a structure that reflects UV components so that at least part of UV radiation can be cut.

For example, the lens 3 may have an SiC fluorescent screen containing N as donor impurities and Al and B as acceptor impurities. The use of an SiC fluorescent screen for the lens 3 allows absorbing UV radiation by the lens 3 and releasing visible light from the lens 3. In this body, it is preferred to have a periodic structure similar to that in the SiC fluorescent substrate 10 on both faces of the SiC fluorescent screen of the lens 3. Furthermore, the SiC fluorescent substrate 10 may be doped with B and N to generate yellow light, while the SiC fluorescent screen of the lens 3 is doped with Al and N to generate blue light, for example. Alternatively, the SiC fluorescent substrate 10 may be doped with Al and N, while the SiC fluorescent screen of the lens 3 is doped with B and N. Thus, the constitution may be such that the SiC fluorescent substrate 10 and the lens 3 can emit light having different wavelengths.

Figure 6:
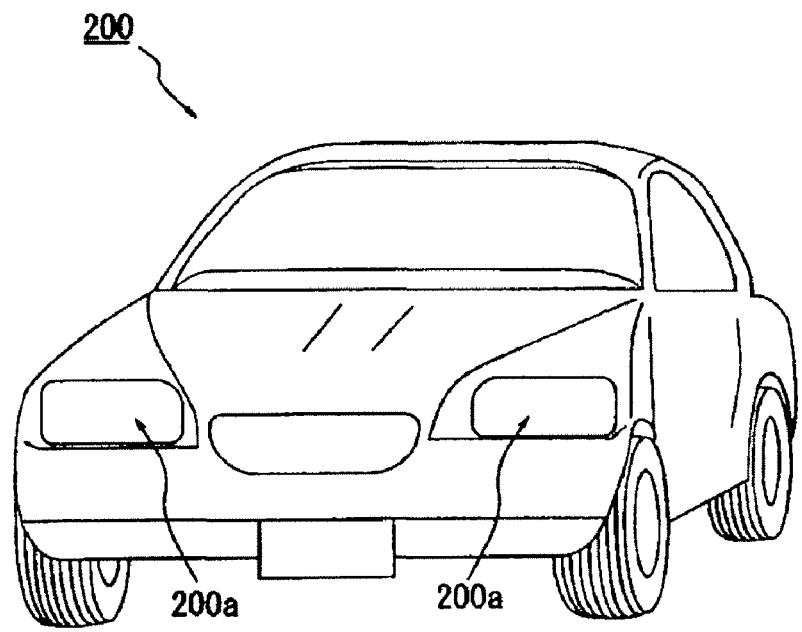
FIG. 6 is a schematic frontal perspective view of an automobile.
Figure 7:
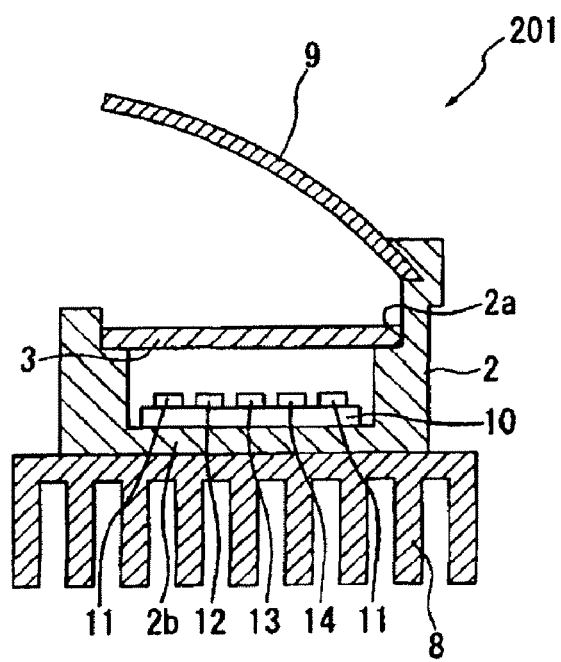
FIG. 7 is a front schematic vertical sectional view of a light emitting device for use as a headlight of an automobile.
Figure 8:
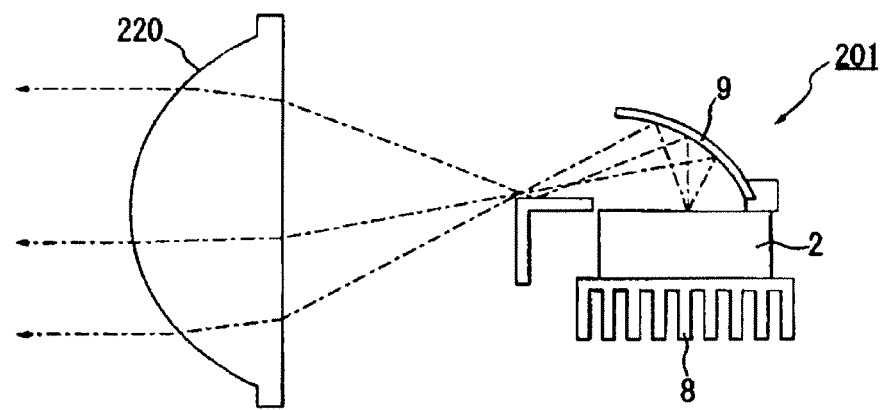
FIG. 8 is an explanatory view showing the internal structure of a modified headlight.
Figure 9:
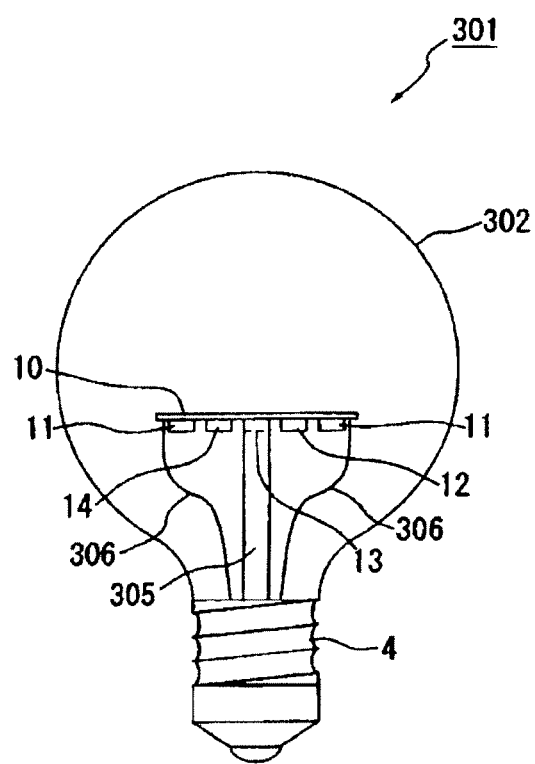
FIG. 9 is a schematic vertical sectional view of another embodiment of the light emitting device of the invention used as a light bulb.

In the light emitting device 1 according to the above-mentioned embodiment, the electric terminal part 4 is screwed into a socket. As shown in FIGS. 6-8, it may also be a light emitting device 201 used for a headlight 200a of a vehicle 200. The vehicle as shown in FIG. 6 is an automobile equipped with headlights 200a on its front part. The light emitting device 201 for the headlights 200a as shown in FIG. 7 is not provided with an electric terminal part on the lower portion of the body 2. Instead, a heat sink 8 is connected to the bottom part 2b of the body 2. Also, on the upper portion of the body 2, a reflecting mirror 9 is provided for reflecting light exiting from the opening 2a. As shown in FIG. 9, white light reflected by the reflecting mirror 9 is converged to a predetermined direction by a lens 220. In this light emitting device 201, the heat sink 8 can be made small compared with a conventional resin sealing type LED headlight because the heat-resistant temperature is high. There is no problem if the heat sink is not provided. It is also possible to connect the light emitting device 201 to a certain section of an automobile, thereby using the body of the automobile as a heat discharging member.

In the above-mentioned embodiment, the body 2 and the electric terminal part 4 are made of AlN. However, any material properties are acceptable as far as inorganic material is used (e.g., Si and SiC). It is also possible to use wavelength conversion SiC doped with acceptor impurities and donor impurities. Moreover, as shown in FIGS. 9 & 10, light emitting devices 301, 401 may be used in which bodies 302, 402 are made of glass that is transparent to visible light.

The light emitting device 301 as shown in FIG. 9 is an LED lamp. The body 302 made of glass is substantially spherical. The electric terminal part 4 is constituted in a way similar to a conventional incandescent bulb. The electric terminal part 4 and the SiC fluorescent substrate 10 are electrically connected to each other with internal electric leads 306. In this light emitting device 301, the SiC fluorescent substrate 10 is disposed at the center of the body 302. The above-mentioned periodic structure is formed on the mounting surface of the LED elements 11, 12, 13, 14 and the surface opposite to the mounting surface. Moreover, the SiC fluorescent substrate 10 is supported by a supporting part 305 that extends from the electric terminal part 4 and is made of inorganic material.

Figure 10:
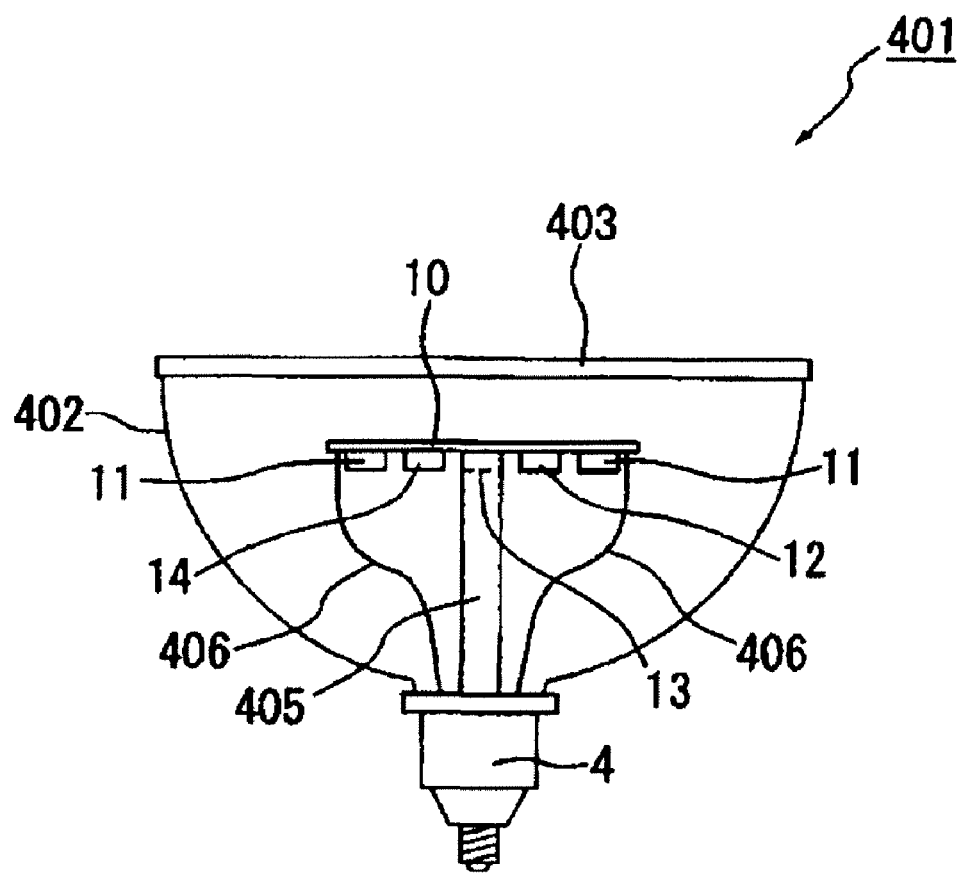
FIG. 10 is a schematic vertical sectional view of a further embodiment of the light emitting device of the invention used as an LED lamp.

The light emitting device 401, as shown in FIG. 10, is an LED lamp. The body 402 made of glass is substantially semi-spherical. A plate-like lens 403 made of glass is provided for closing the opening of the body 402. An electric terminal part 4 is constituted in a way similar to a conventional halogen lamp. The electric terminal part 4 and an SiC fluorescent substrate 10 are electrically connected to each other with internal electric leads 406. In this light emitting device 401, the SiC fluorescent substrate 10 is disposed at the center of the body 402. The above-mentioned periodic structure is formed on the mounting surface of the LED elements 11, 12, 13, 14 and the surface opposite to the mounting surface.

In the light emitting devices 301, 401 shown in FIGS. 9 & 10, respectively, LED elements 11, 12, 13, 14 are mounted only on one side of the SiC fluorescent substrate 10. However, they may be mounted on both sides. In the light emitting devices 301, 401 as shown in FIGS. 9 & 10, respectively, it is also preferred to provide a reflecting film that reflects UV radiation on the bodies 302, 402 and the lens 403 or a UV cutting film that absorbs UV radiation. Furthermore, the bodies 302, 402 and the lens 403 may be made of wavelength conversion SiC doped with acceptor impurities and donor impurities.

Figure 11:
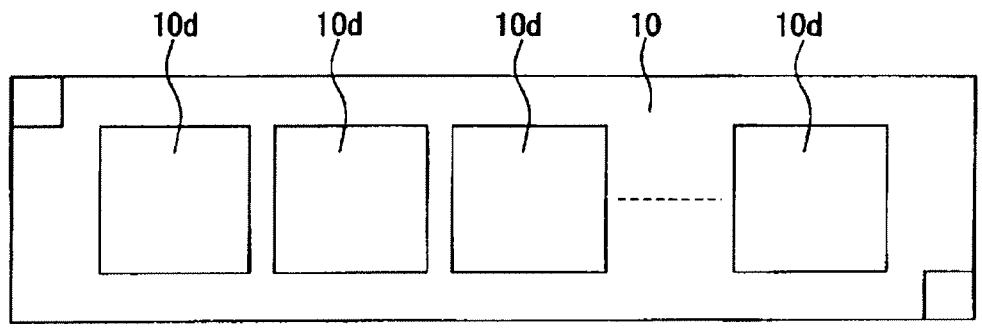
FIGS. 11(a)-11(c) are explanatory views showing one embodiment of the method for mounting LED elements onto an SiC fluorescent substrate, FIG. 11(a) being a plan view of the SiC fluorescent substrate before LED elements are mounted, FIG. 11(b) being a side view of the SiC fluorescent substrate at the time of mounting LED elements and FIG. 11(c) being a side view of the SiC fluorescent substrate after LED elements are mounted.
Figure 11:
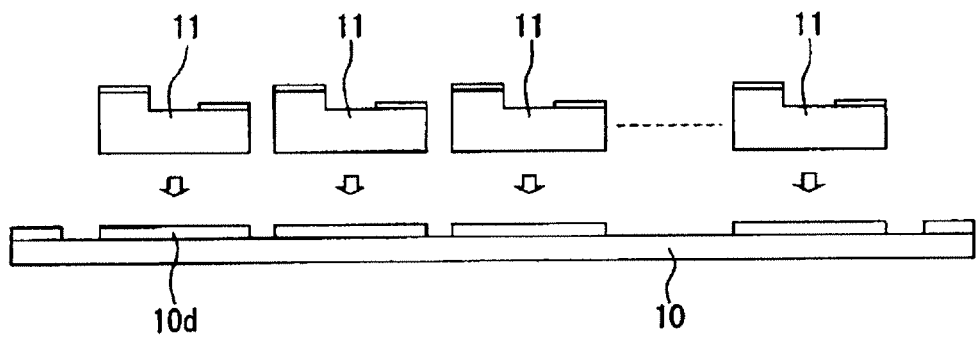
Figure 11:
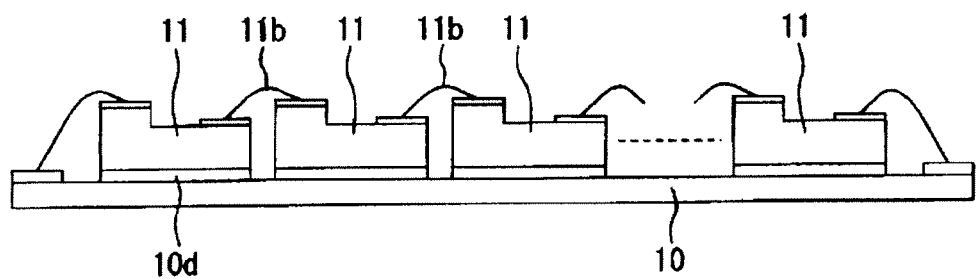

Furthermore, in the above-mentioned embodiment, an Au film 11*a* is formed on each LED element 11 and an Sn film 10*b* on the SiC fluorescent substrate 10 to be bound. However, as shown in FIG. 11, AuSn solder 10*d* may be formed on the SiC fluorescent substrate 10 in advance and then each LED element 11 be solder-joined on the SiC fluorescent substrate 10. Moreover, each LED element 11 is bound to a flip chip in the above-mentioned embodiment. However, it may be a face up joint using wires 11*b* as shown in FIG. 11, for example. Any suitable method for mounting the LED elements 11, 12, 13, 14 is acceptable.

Figure 12A:
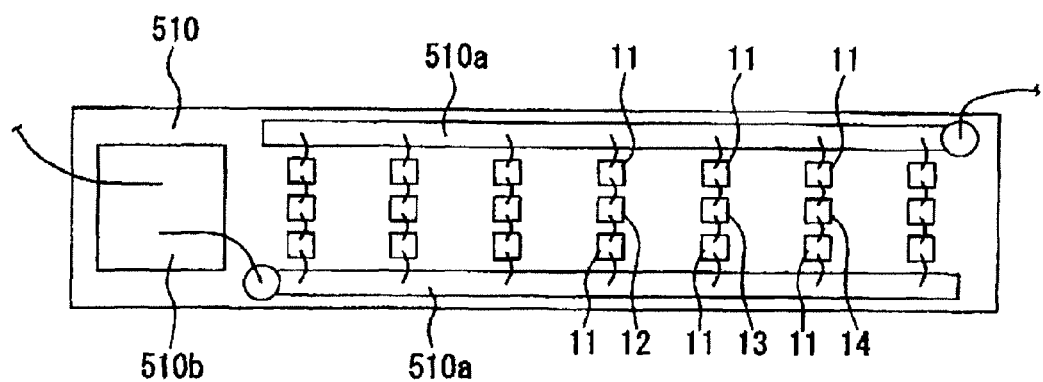
FIG. 12(a) is a plan view of a mounting substrate having seven circuits connected to each other in parallel, wherein each circuit is formed of three LED elements connected to each other in a series
Figure 12B:
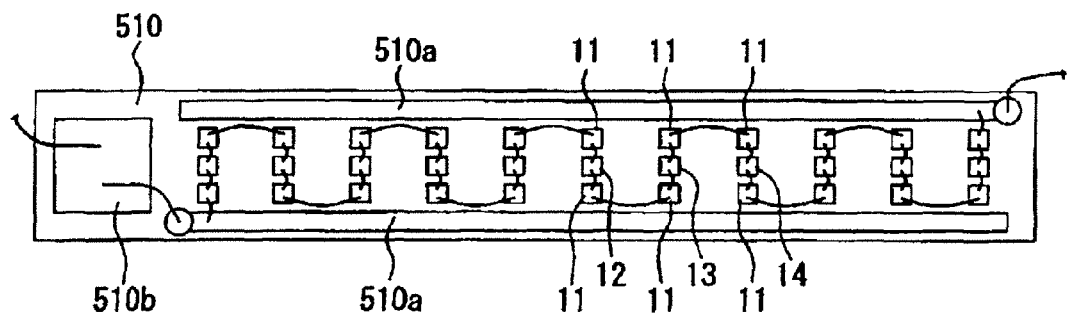
FIG. 12(b) is a plan view of a mounting substrate in which all of the LED elements are connected in series.

Furthermore, an SiC fluorescent substrate 510 may be provided with a rectifying circuit 510*b* for rectifying alternating current to direct current as well as a main circuit pattern 510*a* as shown in FIGS. 12(*a*) & 12(*b*), for example.

The SiC fluorescent substrate 510 as shown in FIG. 12(*a*) and the SiC fluorescent substrate as shown in FIG. 12(*b*) are each used for an LED lamp.

In FIG. 12(*a*), a total of 21 LED elements are mounted on the SiC fluorescent substrate 510. Seven unit circuits are connected to each other in parallel, wherein each unit circuit consists of three LED elements connected to each other in a series by wire bonding. Alternating current of 12 V is used as an electric power supply, and a voltage of about 4 V is applied to each LED element.

In FIG. 12(*b*), a total of 33 LED elements are mounted on the SiC fluorescent substrate 510. All of the LED elements are connected to each other in series by wire bonding. Alternating current of 100 V is used as an electric power supply, and a voltage of about 3 V is applied to each LED element.

Furthermore, the above-mentioned embodiment shows an example of 41 UV LED elements 11, 2 blue LED elements 12, 4 green LED elements 13 and 2 red LED elements 14. However, any number of LED elements 11, 12, 13, 14 can be used. Moreover, it is not necessary to provide all of the blue LED elements 12, green LED elements 13 and red LED elements 14. For example, the percentage of red LED elements 14 can be increased without using blue LED elements 12 in order to generate warm white color. In order to generate cold white color, the percentage of blue LED elements 12 can be increased without using red LED elements 14. In other words, any emission wavelength can be used for each LED element as far as LED elements that emit UV radiation are used as the first LED elements and LED elements that emit visible light are used as the second LED elements. Nevertheless, it is desirable that the peak wavelength of the first LED elements is 408 nm or shorter because the SiC fluorescent substrate 10 is excited by radiation of 408 nm or shorter and that the peak wavelength of the second LED elements exceeds 408 nm.

Furthermore, in the above-mentioned embodiment, LED elements 11, 12, 13, 14 are not sealed. However, they may be sealed by inorganic material, such as transparent glass. In this case, since the sealing material is inorganic, the heat resistance of the light emitting device 1 is not imparted in any way.

Furthermore, in the above-mentioned embodiment, the SiC fluorescent substrate 10 is doped with both Al and B as acceptors. However, either one of Al and B may be used as an acceptor for doping. In the case of using only Al as an acceptor and N as a donor, fluorescent light having a peak wavelength in the blue region is emitted. In the case of using only B as an acceptor and N as a donor, fluorescent light having a peak wavelength in the yellow region is emitted. In other words, it is preferable to use only B as an acceptor in order to generate warm white color and only Al as an acceptor in order to generate cold white color. It goes without saying that other specific details of structure can appropriately be altered as well.

What is claimed is:

1. A light emitting device comprising:
   first LED elements for emitting UV radiation;
   second LED elements for emitting visible light;
   an SiC fluorescent substrate on which the first LED elements and the second LED elements are mounted, which is made of SiC doped with at least one of B and Al as well as N and which emits visible light when excited by radiation emitted from the first LED elements; and
   a body that contains the SiC fluorescent substrate and is made of an inorganic material;
   wherein the SiC fluorescent substrate comprises a periodic structure having a period that is shorter than the emission wavelength of the first LED elements on the substrate.

2. The light emitting device according to claim 1, wherein the first LED elements have a peak wavelength of 408 nm or shorter, and wherein the second LED elements have a peak wavelength which exceeds 408 nm.

3. The light emitting device according to claim 1, wherein the body has an opening, and wherein a transparent member made of a transparent inorganic material is provided in the opening to enable light to be emitted from the second LED elements and the SiC flourescent substrate.

4. The light emitting device according to claim 3, wherein the transparent member is adapted for removing at least part of UV components from the emitted radiation.

5. The light emitting device according to claim 4, wherein the transparent member is made of SiC doped with at least one of B and Al as well as N and absorbs radiation emitted from the first LED elements for emitting visible light.

6. A light emitting device comprising:
   UV LED elements for emitting UV radiation;
   blue LED elements for emitting blue light;
   green LED elements for emitting green light;
   red LED elements for emitting red light;
   an SiC fluorescent substrate to which the UV LED elements, the blue LED elements, green LED elements and the red LED elements are mounted and which is made of SiC doped with at least one of B and Al as well as N and emits visible light when excited by radiation emitted from the UV LED elements; and
   a body that contains the SiC fluorescent substrate and is made of inorganic material;
   wherein the SiC fluorescent substrate comprises a periodic structure having a period that is shorter than the emission wavelength of the UV LED elements on the substrate.

7. A light emitting device comprising:
   first LED elements for emitting UV radiation;
   second LED elements for emitting visible light;
   an SiC fluorescent substrate on which is mounted the first LED elements and the second LED elements and which is made of SiC doped with at least one of B and Al as well as N and emits visible light when excited by radiation emitted from the first LED elements; and
   an AuSn type alloy layer that binds the first LED elements and the second LED elements to the SiC fluorescent substrate and comprises columnar crystals extending substantially in a direction perpendicular to the SiC fluorescent substrate;

wherein the SiC fluorescent substrate comprises a periodic structure having a period that is shorter than the emission wavelength of the first LED elements on the substrate.

8. The light emitting device according to claim 7 comprising a body that contains the SiC fluorescent substrate and is made of inorganic material.

9. The light emitting device according to claim 7, wherein a peak wavelength of the first LED elements is 408 nm or shorter, and wherein the peak wavelength of the second LED elements exceeds 408 nm.

10. The light emitting device according to claim 7, wherein the second LED elements comprise blue LED elements, green LED elements and red LED elements.

* * * * *